US006215879B1

(12) United States Patent
Dempsey

(10) Patent No.: US 6,215,879 B1
(45) Date of Patent: Apr. 10, 2001

(54) METHOD FOR INTRODUCING HARMONICS INTO AN AUDIO STREAM FOR IMPROVING THREE DIMENSIONAL AUDIO POSITIONING

(75) Inventor: Morgan James Dempsey, Orlando, FL (US)

(73) Assignee: Philips Semiconductors, Inc., Tarrytown, NY (US)

( * ) Notice: Subject to any disclaimer, the term of this patent is extended or adjusted under 35 U.S.C. 154(b) by 0 days.

(21) Appl. No.: 08/974,131

(22) Filed: Nov. 19, 1997

(51) Int. Cl.[7] .......... H03G 3/00
(52) U.S. Cl. .......... 381/61
(58) Field of Search .......... 381/61, 98, 103

(56) References Cited

U.S. PATENT DOCUMENTS 5,133,014 * 7/1992 Pritchard .......... 381/61
5,754,666 * 5/1998 Nakagawa .......... 381/98
5,828,755 * 10/1998 Feremans et al. .......... 381/61
5,841,875 * 11/1998 Kuroki et al. .......... 381/61
6,134,330 * 10/2000 De Poortere et al. .......... 381/61

OTHER PUBLICATIONS

U.S. application No. 08/974,134, Dempsey, filed Nov. 19, 1997.

* cited by examiner

*Primary Examiner*—Forester W. Isen
*Assistant Examiner*—Brian T. Pendleton

(57) ABSTRACT

Method for introducing harmonics into an audio stream for improving three dimensional audio positioning. The method adds high frequency harmonics into sampled sound signals to replace high frequency sound components eliminated before sampling. By adding high frequency harmonics into the sampled sound signals, a "richer sound" will be produced. The resulting sampled sound signals will have a frequency spectrum containing a larger number of frequencies. Thus, the ear will have more cues to better position the sampled sound signals.

12 Claims, 1 Drawing Sheet

METHOD FOR INTRODUCING HARMONICS INTO AN AUDIO STREAM FOR IMPROVING THREE DIMENSIONAL AUDIO POSITIONING

RELATED APPLICATIONS

This application is related to the application entitled "METHOD FOR CUSTOMIZING HRTF TO IMPROVE THE AUDIO EXPERIENCE THROUGH A SERIES OF TEST SOUNDS" filed concurrently herewith, in the name of the same inventor, and assigned to the same assignee as this Application. The disclosure of the above referenced application is hereby incorporated by reference into this application.

FIELD OF THE INVENTION

This invention relates generally to audio sounds and, more specifically, to a method for introducing harmonics into an audio stream to provide more convincing and pleasurable three dimensional audio works.

BACKGROUND OF THE INVENTION

Over the years, the audio industry has introduced new technologies that have steadily improved the realism of reproduced sounds. The 1940's monaural high fidelity technology led to the 1950's stereo. In the 1980's, digitally based stereo was introduced to improved the realism of reproduced sounds. Recently, spatial enhanced sound systems have come into existence. These systems give the listener a 180 degree, planner two dimensional presentation of sound. Listeners perceive a "widened" or "broadened" soundstage where sounds apparently are not limited to the space between the two speakers as in a conventional stereo system. Although offering more depth than conventional stereo systems, it falls short of providing full and realistic three-dimensional sounds.

Positional three-dimensional sound systems recreate all of the audio cues associated with a real world, and sometimes surrealworld, audio environment. The big difference between spatial enhanced and positional three-dimensional sound is that spatial sound uses two tracks and must evenly apply signal processing to all sounds on the track. Positional three-dimensional audio processes individual sounds according to Head Related Transfer Function (HRTF) techniques and then mixes the processed individual sounds back together before final amplification. This enables imbuing individual sounds with sufficient spatial cuing information to present an accurate, convincing rendering of an audio soundscape just as one would hear it in real life.

In a typical sampling arrangement, sound is typically sampled at a plurality of different rates ranging from 48 kHz all the way down to 5 kHz (sound is typically stored at 48, 44.1, 22.05, 11.025, and 5.6125 kHz). The reason for having the different sampling rates is that programmers are trying to save as much memory space as possible. Programmers do not want to use all the memory space on sound.

The main problem with sampling is that the corresponding maximum frequency that may be reproduced is approximately 20,000, 10,000, 5,000, and 2,500 respectively. This is due to the fact that under sampling theory, one can reproduce a frequency which is less than half the sampled frequency. Thus, even though most sounds contain some high frequency components, frequencies above the maximum are eliminated before sampling. The result is that sounds stored at lower sampled rates do not lend themselves very well to three dimensional audio positioning. As an example, if a sound has few high frequency components, the sound will be filtered to eliminate the high frequencies and then sampled at the lowest rate possible to conserve sample size. The sampled sound will then be converted up and positioned. The problem is that the sound will only have the low frequency components to position. Therefore, the listener will only receive a small percentage of the cues required to properly position the sound.

Therefore, a need existed to provide a method of improving three-dimensional sounds for all listeners. The method will allow higher frequency harmonics to be added into sampled sounds thereby creating a replica of the high frequency sound components that were eliminated prior to sampling. The method will provide a resulting frequency spectrum containing a larger number of frequencies that may be manipulated to allow for more realistic three dimensional audio positioning.

SUMMARY OF THE INVENTION

In accordance with one embodiment, the present invention provides a method of improving three-dimensional sounds for all listeners.

Another example embodiment of the present invention provides a method which will allow higher frequency harmonics to be added into the sampled sounds.

Another example embodiment of the present invention provides a method which will allow higher frequency harmonics to be added into the sampled sounds thereby creating a replica of the high frequency sound components that were eliminated prior to sampling.

Another example embodiment of the present invention provides a method for providing a resulting frequency spectrum that contains a large number of frequencies that may be manipulated to create a more realistic three dimensional audio sound.

BRIEF DESCRIPTION OF THE PREFERRED EMBODIMENTS

In accordance with one embodiment of the present invention, a method of introducing harmonics into an audio stream for improving three dimensional audio positioning is disclosed.

The method comprises the steps of: providing a sampled sound signal; and adding high frequency harmonics into the sampled sound signal to replace high frequency sound components eliminated before sampling to allow a listener to position the sampled sound signal.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENTS

Figure 1:
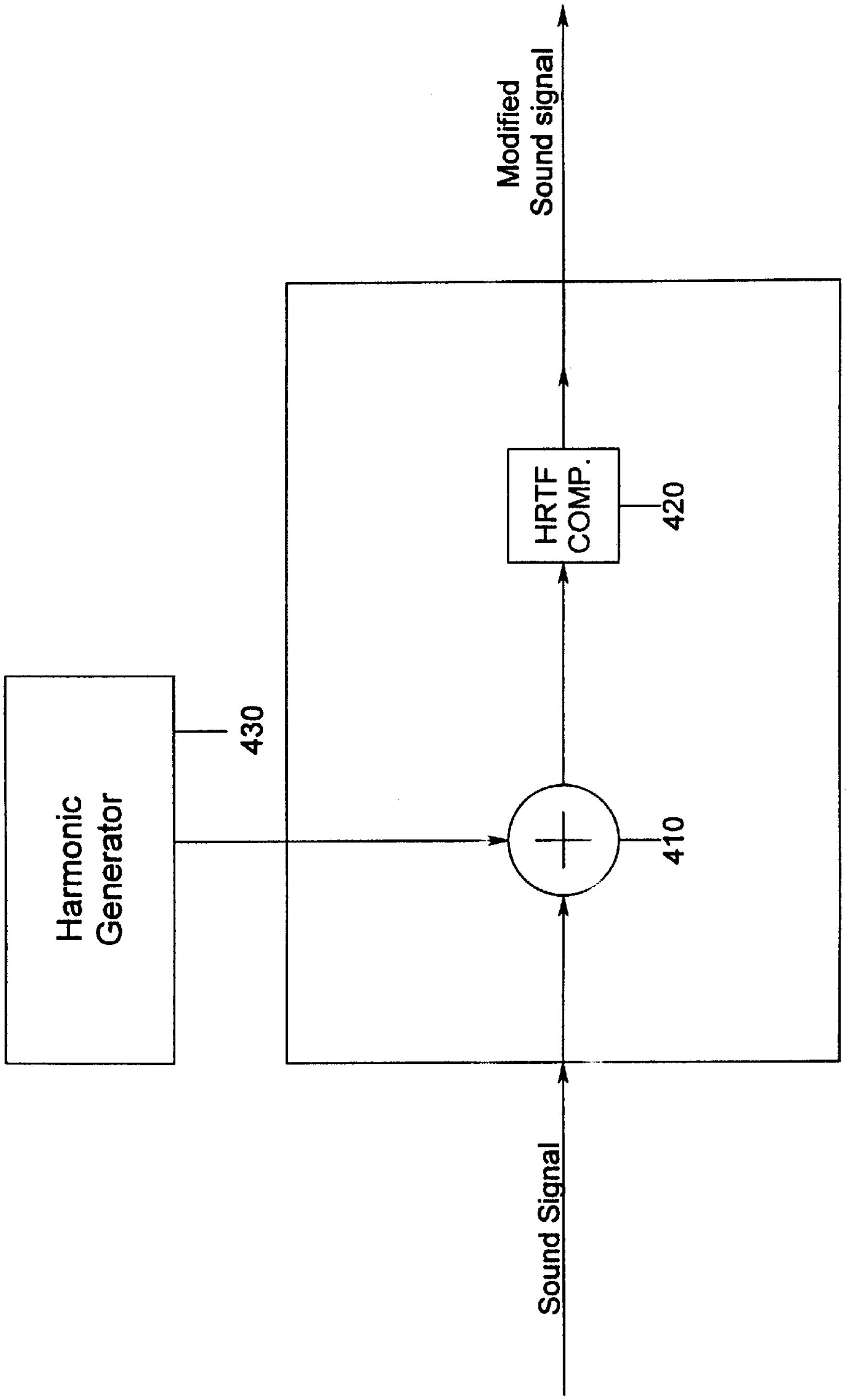
FIG. 1 shows a preferred embodiment of the invention

What individuals interpret as simple sounds are actually made up of one or more frequencies. How the individual hears and interprets these frequencies determines where he/she thinks the sound came from. The human brain uses a plurality of different cues to discern where a particular sound is emanating from. The first cue the brain uses to locate sounds is the time difference between the sound reaching one ear and then the other ear. The ear that hears the sound first is closer to the source. The longer the delay to the more distant ear, the brain infers that the sound came from a greater angle from the more distant ear to the sound source. Using triangulation, the brain discerns where the sound came from horizontally. Unfortunately, this method has a few limitations. If only interaural time differences are used, the brain is unable to distinguish whether the sound is above or below the horizontal plane of the ears. Second, the brain is unable to distinguish between front and back. The time delay for 60 degrees to the right front is the same as the delay for 60 degrees to the right rear. Third, only sounds at certain frequencies can be used for calculating time differences.

To distinguish time delays between the ears, the brain must be able to discern a clear and identifiable difference between the sound as it reaches the two ears. Human heads are about seven inches wide at the ears. Sound travels in air at about 1088 feet per second. Humans can hear sounds between 20 and 20,000 Hz with the wavelength being directly related to the frequency according to the equation:

$$\text{Frequency}=1088/\text{Wavelength} \quad (1)$$

At very low frequencies (i.e., under 250 Hz) the difference between signals at two ears is minimal. Therefore, the brain cannot effectively identify time differences. At frequencies above 2000 Hz, the wavelengths are shorter than seven inches. Thus, the brain cannot tell that one ear is a cycle or more behind the other and cannot correctly calculate the time difference. This means that the brain can only calculate time delays for audio frequencies between 250–1500 Hz.

A second cue used for determining horizontal direction is sound intensity. Noises come from the right sound loudest to the right ear. The left ear perceives a lower intensity sound because the head creates an audio shadow. As with time difference calculations, sound frequency affects right/left intensity perceptions. The average seven inch wide head can only shadow frequencies higher than 4000 Hz.

Remember, the brain registers the difference between the two ears. The actual shape of the curves change with frequency. Just as with time difference calculations, intensity difference calculations cannot account for vertical positioning (i.e., elevation) or front-to-back positions.

Two frequency bands have been neglected up to this point: the sub 250 Hz band, and the 1500 to 4000 Hz band. As can be seen, the human brain has no ability to identify the position of a sound in these ranges. If a sound is made up of a pure sine wave in the 3000 Hz range, humans would not be able to locate the source. This is why in a crowded room when a pager goes off (i.e., the pager making a sound having a pure tone having a frequency which the human brain has no ability to identify the position of the sound), no one can determine who's pager went off, so everyone checks. Fortunately, most sounds are not pure tones.

Humans perceive sounds from behind as being muffled. The shape of the human head and the slightly forward facing ears work as audio frequency filters. Frequencies between 250 and 500 Hz and above 4000 Hz are relatively less intense when the source is behind the individual. Frequencies between 800 and 1800 Hz are less intense when the source is in front. Most sounds, including high intensity ones, are made up of many different frequencies. If an individual perceives that higher frequencies, those between 800 to 18,000 Hz, are louder than lower ones (those in the 250 to 500 Hz range), then the person assumes that the sound source was in front. If the lower frequency components seem louder, the person assumes that the sound source was from behind.

A person's memory of common sounds also assists the brain in frequency evaluations. Unconsciously, individuals learn the frequency content of common sounds. When an individual hears a sound, he/she will compare it to the frequency spectrum in his/her memory. The spectrum rules concerning front or back location of the source completes the calculations. Sometimes, the front to back location is still unclear. Without thinking, people turn their heads to align one ear towards the sound source so that the sound intensity is highest in one ear.

Identifying the location of a sound source on a horizontal plane is relatively easy for two ears, but locating a sound in the vertical direction is much harder and inherently less accurate. As before, frequency is the key. However, a sound's interaction with the ear's pinna (i.e., the folds in the outer part of the ear) provide clues to the location of sounds.

The pinna creates different ripples depending on the direction where the sound came from. Each fold in the pinna creates a unique reflection. The reflections depend on the angle at which the sound hits the ear and the frequency of the sounds heard. A cross section of any radius gives a unique ripple pattern that identifies not only up or down, but also supports the interpretation of front and back.

The wavelength and magnitude of the ripples create a complex frequency filter. The brain uses the high frequency spectrum to locate the vertical sound source. For any given angle of elevation, some frequencies will be enhanced, while others will be greatly reduced. The brain correlates the frequency response it hears with a particular angle, and the vertical direction is identified.

Unfortunately, there are some limitations to our ability to determine elevation in sound sources. The pinna is only effective with frequencies above 4000 Hz. If a sound is made up entirely of frequencies below 4000 Hz, the pinna effect will be negligible and the person will not be able to identify the vertical direction of the source.

Sound sources that are near by seem to be louder than those that are farther away. This feature of sound is called rolloff. Objects in the path of the sound wave may act as filters to attenuate higher frequency components. Listening to someone across a lake, a person can hear them clearly as if they were near by. This is due to the fact that the lake is smooth. The lake is a perfect reflector with nothing to interfere with the sound waves. Given the same distance in a dense forest, one would not be able to hear as clearly. The trees would interfere with the sound waves. The trees would absorb and redirect the sound waves, making identification of the sounds virtually impossible.

A radio in an open field sounds flat and mute when compared to the same radio playing in an enclosed room. Sounds reflected by the floors and walls in the enclosed room help counter rolloff and add depth to the sounds. The brain does not confuse reflection variations (ripples, time delays, and echoes) because the time differences are significant. Ripples are on the order of less than 0.1 ms. Time delays are less than 0.7 ms. Echoes result from reflections from objects or walls. Echoes are only noticeable if the delay is greater than 35 ms. Echoes with delay times of less than 35 ms are filtered out and ignored by the brain. However, sub 35 ms echoes create the reverb content, or richness individuals perceive in sounds subject to reflection.

Motion also plays a role is sound determination. Everyone has noticed that an approaching ambulance siren sounds increasingly high pitched until it reaches the listener. The ambulance siren sounds progressively lower pitched as it recedes. This is called the Doppler effect. This effect would be the same if the ambulance remained stationary and the listener moved passed the ambulance at road speed. The faster the relative speed, the greater the frequency shift. The frequency shift occurs because as the sound approaches objects, the leading sound wave is compressed into shorter wavelengths while the trailing waves, if any, are "stretched" into longer waves. Shorter waves are higher in frequency. So as a sound source approaches, all the sounds have a higher frequency. The trailing waves of sound sources that are moving away would be lower in frequency.

Sounds emanating from point sources expand outward to form directional sound cones. Consider a man with a megaphone. When the megaphone is pointed more or less at a listener (i.e., the inner cone), the volume remains constant. As the megaphone swings away from the observer (i.e., the outer cone), the volume drops rapidly. Then there comes a point where the megaphone turns outside the cone and the volume remains virtually constant and low.

A listener's right and left ears may be located in different cones generated by a single sound. Consider a person whispering in your ear. One ear is in the inner cone while the other ear is both in the inner and outer cone. Consider the same person whispering a few feet away. One ear is in the inner cone while the other ear is in the outer cone. While this defeats some of the positional identification, it is an integral part of a person's perception of the audile world.

The Head Related Transfer Function (HRTF) is a mathematical model that describes how the brain and ear work together to perceive sounds in positional three-dimensional space. HRTF makes the difference between our experience and that of recording. HRTF is a function that identifies sound intensities as It a function of direction. All of the frequency related concepts discussed above are based on this function.

Each person learns the response of their own HRTF from infancy. HRTF is greatly affected by the size and shape of the listener's head and ears. Since all people are slightly different, every individual has a unique HRTF. Three-dimensional audio works because most people's HRTF are similar enough to be convincing to a majority of people. However, many people are not convinced by standard three-dimensional audio sounds. Furthermore, even for those individuals where three-dimensional audio sounds are effective, a majority of them will feel that the average function is realistic but not truly convincing.

As stated above, under sampling theory, one can only reproduce a frequency which is less than half the sampled frequency. Thus, even though most sounds contain some high frequency components, frequencies above the maximum are eliminated before sampling. The result is that sounds stored at lower sampled rates do not lend themselves very well to three dimensional audio positioning. However, by adding high frequency harmonics into the stored sound prior to performing three dimensional HRTF calculations, a "richer sound" will be produced. The resulting sound will have a frequency spectrum that contains a larger number of frequencies. These frequencies can be manipulated by HRTF to create a more realistic three dimensional sound.

Thus, under the present method, one must estimate what the high frequency components that were sampled out might look like for a particular stored sound sample. The high frequency components are then reintroduced into the sound sample. The modified sample may then be positioned such that the sound sample provides a more convincing three dimensional audio sound.

The estimation of the high frequency components is not a difficult process. Most sounds are comprised of a fundamental frequency and multiples of the fundamental frequency called harmonics. Since audio comes in multiples of the main frequency, the frequency of the sound sample may be measured and multiples of the main frequency may be added back into the audio sample. The added multiples that are added back into the stored sound should start out being relatively loud and then die out over a short time frame. This is due to the fact that the high frequency components are likely to diminish over time.

The exact high frequency components do not necessarily have to be reintroduced into the stored sound sample. The key is to reintroduce high frequency components into the sound sample in order to allow the ears to position the sound. This will allow an individual listening to the sound sample to identify where the general direction of the rest of the sound is located. By reintroducing high frequency components into the sound sample, the ear will have more cues to position the sound sample.

There are several different ways of adding harmonics into the sound sample. One way is to use a ringing filter. The ringing filter response should be related to the sample cutoff frequency. The ringing filter is similar to the tube amplifier. Tube amplifiers provide the desired frequency but they also ring. The tube amplifier reacts to the sound signal that is coming in and adds in the harmonics (i.e. rings). Thus, what is wanted is a filter which rings like the tube amplifier. Ringing filters are known to those skilled in the art and will not further be discussed. Another way of adding in the harmonics is to take the digital frequencies of the sounds that are being inputted. The frequency of the desired sounds must then be determined and reintroduced back into the sound sample.

FIG. 1 shows a sound signal being modified, according to an example embodiment of the present invention. A harmonic generator 430 generates high frequency harmonics which are added to a sampled sound signal at adder 410. HRTF calculations are performed on the sound signal at a HRTF computational device 420, and a modified sound signal is output therfrom.

While the invention has been particularly shown and described with reference to preferred embodiments thereof, it will be understood by those skilled in the art that the foregoing and other changes in form, and details may be made therein without departing from the spirit and scope of the invention.

What is claimed is:

1. Method for introducing harmonics into an audio stream for improving three dimensional audio positioning comprising the steps of providing a sampled sound signal;

adding high frequency harmonics into said sampled sound signal to replace high frequency sound components eliminated before sampling to allow a listener to position said sampled sound signal; and performing three dimensional transfer function calculations, including identifying sound intensities as a function of sound signal direction, on the audio stream.

2. Method for introducing harmonics into an audio stream for improving three dimensional audio positioning in accordance with claim 1 further comprising the steps of:

starting out said high frequency harmonics at a higher volume than said sample sound signal; and diminishing volume of said high frequency harmonics over a short time frame.

3. Method for introducing harmonics into an audio stream for improving three dimensional audio positioning in accordance with claim 1 wherein said step of adding high frequency harmonics into said sampled sound signal further comprises the step of adding said high frequency harmonics using a ringing filter.

4. Method for introducing harmonics into an audio stream for improving three dimensional audio positioning in accordance with claim 1 wherein said step adding high frequency harmonics into said sampled sound signal further comprises the steps of:

measure frequencies of said sampled sound signal;

determine high frequency harmonics of said sampled sound signals; and adding said high frequency harmonics into said sampled sound signal.

5. Method for introducing harmonics into an audio stream for improving three dimensional audio positioning comprising the steps of:

providing a sampled sound signal;

adding high frequency harmonics into said sampled sound signal to replace high frequency sound components eliminated before sampling to allow a listener to position said sampled sound signal;

starting out said high frequency harmonics at a higher volume than said sample sound signal; and diminishing volume of said high frequency harmonics over a short time frame.

6. Method for introducing harmonics into an audio stream for improving three dimensional audio positioning in accordance with claim 6 wherein said step of adding high frequency harmonics into said sampled sound signal further comprises the step of adding said high frequency harmonics prior to performing three dimensional Head Related Transfer Function (HRTF) calculations.

7. Method for introducing harmonics into an audio stream for improving three dimensional audio positioning in accordance with claim 6 wherein said step of adding high frequency harmonics into said sampled sound signal further comprises the step of adding said high frequency harmonics using a ringing filter.

8. Method for introducing harmonics into an audio stream for improving three dimensional audio positioning in accordance with claim 6 wherein said step adding high frequency harmonics into said sampled sound signal further comprises the steps of:

measure frequencies of said sampled sound signal;

determine high frequency harmonics of said sampled sound signals; and adding said high frequency harmonics into said sampled sound signal.

9. A method for introducing harmonics into an audio stream for three dimensional audio positioning, the method comprising:

providing a sampled sound signal taken from an original sound signal, the sampled sound signal having a frequency less than the frequency of the original sound signal;

adding high frequency harmonics into the sampled sound signal at a volume higher than the sampled sound signal, the high frequency harmonics being selected to compensate for the sampled sound signal having a frequency less than the frequency of the original sound signal such that the sampled sound signal combined with the added high frequency harmonics more accurately represents the original sound signal, the added high frequency harmonics improving a listener's ability to three-dimensionally position said sampled sound signal; and diminishing the volume level of the high frequency harmonics over time, the diminishing being modeled after the volume level of the original sound signal.

10. A method for introducing harmonics into an audio stream for improving three dimensional audio positioning comprising the steps of:

providing a sampled sound signal;

adding high frequency harmonics into said sampled sound signal to replace high frequency sound components eliminated before sampling to allow a listener to position said sampled sound signal, the added high frequency harmonics being initially added at a higher volume than the sampled sound signal and subsequently being diminished in volume over a short time frame; and performing three dimensional Head Related Transfer Function (HRTF) calculations on the audio stream.

11. The method of claim 10, wherein adding high frequency harmonics includes using a ringing filter.

12. The method of claim 10, wherein adding high frequency harmonics comprises:

measuring frequencies of the sampled sound signal;

determining high frequency harmonics of the sampled sound signal; and adding the high frequency harmonics into the sampled sound signal.

* * * * *

UNITED STATES PATENT AND TRADEMARK OFFICE

CERTIFICATE OF CORRECTION

PATENT NO. : 6,215,879 B1
DATED : April 10, 2001
INVENTOR(S) : Dempsey

It is certified that error appears in the above-identified patent and that said Letters Patent is hereby corrected as shown below:

Column 6,
Line 48, "steps of" should read -- steps of: --; and starting at "providing", the rest of line 48 should begin a new line.

Signed and Sealed this

Twenty-third Day of April, 2002

Attest:

JAMES E. ROGAN

*Attesting Officer*

*Director of the United States Patent and Trademark Office*